(12) United States Patent
Cheng et al.

(10) Patent No.: US 6,863,772 B2
(45) Date of Patent: Mar. 8, 2005

(54) DUAL-PORT END POINT WINDOW FOR PLASMA ETCHER

(75) Inventors: Ping-Jen Cheng, Chung Li (TW); Huan-Liang Tzeng, Hsinchu (TW); Jung-Hsiang Chang, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 221 days.

(21) Appl. No.: 10/267,574

(22) Filed: Oct. 9, 2002

(65) Prior Publication Data

US 2004/0069408 A1 Apr. 15, 2004

(51) Int. Cl.[7] .......................... H01L 21/306; C23F 1/00; C23C 16/50
(52) U.S. Cl. .......................... 156/345.16; 156/345.15; 156/345.24; 156/345.25; 118/715; 118/663; 118/712; 118/713
(58) Field of Search .................. 156/345.15, 345.16, 156/345.24, 345.25; 118/715, 663, 712, 713

(56) References Cited

U.S. PATENT DOCUMENTS

| | | | | | |
|---|---|---|---|---|---|
| 4,407,709 A | * | 10/1983 | Enjouji et al. | ......... | 204/192.13 |
| 4,491,499 A | * | 1/1985 | Jerde et al. | .................... | 216/60 |
| 4,836,140 A | * | 6/1989 | Koji | ............................ | 118/722 |
| 4,857,136 A | * | 8/1989 | Zajac | .......................... | 438/16 |
| 4,982,693 A | * | 1/1991 | Ebata | .......................... | 118/666 |
| 5,002,631 A | * | 3/1991 | Giapis et al. | .................. | 216/60 |
| 5,255,286 A | * | 10/1993 | Moslehi et al. | .............. | 374/121 |
| 5,290,383 A | * | 3/1994 | Koshimizu | .............. | 156/345.25 |
| 5,317,656 A | * | 5/1994 | Moslehi et al. | ................ | 385/12 |
| 5,322,590 A | * | 6/1994 | Koshimizu | ..................... | 438/9 |
| 5,352,902 A | * | 10/1994 | Aoki | ........................... | 250/575 |
| 5,473,162 A | * | 12/1995 | Busch et al. | .............. | 250/341.6 |
| 5,508,934 A | * | 4/1996 | Moslehi et al. | .............. | 700/121 |
| 5,534,066 A | * | 7/1996 | O'Neill et al. | .............. | 118/663 |
| 5,728,253 A | * | 3/1998 | Saito et al. | ............ | 156/345.25 |
| 5,759,424 A | * | 6/1998 | Imatake et al. | ............... | 216/60 |
| 5,837,094 A | * | 11/1998 | Tsukazaki et al. | ...... | 156/345.25 |
| 5,880,823 A | * | 3/1999 | Lu | .............................. | 356/72 |
| 6,042,650 A | * | 3/2000 | Uesugi et al. | .............. | 118/712 |
| 6,074,568 A | * | 6/2000 | Adachi et al. | ................. | 216/59 |
| 6,077,387 A | * | 6/2000 | Tesauro | ................. | 156/345.24 |
| 6,176,933 B1 | * | 1/2001 | Yang | .......................... | 118/722 |
| 6,191,397 B1 | * | 2/2001 | Hayasaki et al. | ........... | 219/497 |
| 6,207,008 B1 | * | 3/2001 | Kijima | ........................ | 216/59 |
| 6,235,119 B1 | * | 5/2001 | Yang | .......................... | 118/722 |
| 6,284,049 B1 | * | 9/2001 | Uesugi et al. | .............. | 118/712 |
| 6,306,246 B1 | * | 10/2001 | Melvin et al. | ......... | 156/345.25 |
| 6,537,832 B2 | * | 3/2003 | Otsubo et al. | ................ | 438/14 |
| 6,547,458 B1 | * | 4/2003 | Janos et al. | .................. | 396/611 |
| 6,562,186 B1 | * | 5/2003 | Saito et al. | ............. | 156/345.24 |
| 6,603,101 B2 | * | 8/2003 | Hayasaki et al. | ........... | 219/502 |
| 6,712,928 B2 | * | 3/2004 | Nakano et al. | ........ | 156/345.24 |
| 2003/0054657 A1 | * | 3/2003 | Kim | .......................... | 438/710 |

FOREIGN PATENT DOCUMENTS

| | | | | | |
|---|---|---|---|---|---|
| JP | 58006124 A | * | 1/1983 | ......... | H01L/21/205 |
| JP | 62196818 A | * | 8/1987 | ......... | H01L/21/203 |

* cited by examiner

*Primary Examiner*—Rudy Zervigon
(74) *Attorney, Agent, or Firm*—Tung & Associates

(57) ABSTRACT

A dual-port endpoint detection window for a process chamber for substrates. The dual-port endpoint detection window of the present invention comprises a primary port and a secondary port each of which may be individually removably fitted with a light sensor for the endpoint detection system. A cover is provided for removably covering the secondary port. After the window of the primary port has become covered with material deposition as a result of prolonged use of the process chamber, the secondary port is uncovered for use and the light sensor is attached to the secondary port for continued use of the endpoint detection system through the secondary port.

10 Claims, 2 Drawing Sheets

DUAL-PORT END POINT WINDOW FOR PLASMA ETCHER

FIELD OF THE INVENTION

The present invention relates to etching processes for etching insulative and conductive layers on a semiconductor wafer. More particularly, the invention relates to a dual-port end point window which prolongs end point monitoring capability in an etching chamber over prolonged periods of etching.

BACKGROUND OF THE INVENTION

Integrated circuits are formed on a semiconductor substrate, which is typically composed of silicon. Such formation of integrated circuits involves sequentially forming or depositing multiple electrically conductive and insulative layers in or on the substrate. Etching processes may then be used to form geometric patterns in the layers or vias for electrical contact between the layers. Etching processes include "wet" etching, in which one or more chemical reagents are brought into direct contact with the substrate, and "dry" etching, such as plasma etching.

Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals and electrons by using an RF (radio frequency) generator, which includes one or more electrodes. The electrodes are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

As discussed above, plasma includes high-energy ions, free radicals and electrons which react chemically with the surface material of the semiconductor wafer to form reaction produces that leave the wafer surface, thereby etching a geometrical pattern or a via in a wafer layer. Plasma intensity depends on the type of etchant gas or gases used, as well as the etchant gas pressure and temperature and the radio frequency generated at an electrode in the process chamber by an RF generator. If any of these factors changes during the process, the plasma intensity may increase or decrease with respect to the plasma intensity level required for optimum etching in a particular application. Decreased plasma intensity results in decreased, and thus incomplete, etching. Increased plasma intensity, on the other hand, can cause over etching and plasma-induced damage of the wafers. Plasma-induced damage includes trapped interface charges, material defects migration into bulk materials, and contamination caused by the deposition of etch products on material surfaces. Etch damage induced by reactive plasma can alter the qualities of sensitive IC components such as Schottky diodes, the rectifying capability of which can be reduced considerably. Heavy-polymer deposition during oxide contact hole etching may cause high-contact resistance.

Furthermore, plasma-etching techniques are incapable of discriminating between the layer or layers to be etched and the underlying layer or layers, which should remain unaffected by the etching process. For these reasons, the plasma reactor must be equipped with a monitor that indicates when the etching process is to be stopped. Such a monitor may utilize an end-point system or mode to terminate etching in order to prevent undesired etching of the underlying layer on the wafer.

One type of end point detection system commonly used in plasma etching processes is optical emission spectroscopy, which analyzes the light emitted by energized atoms and molecules in the gas discharge leading from the etching chamber. This is accomplished by using a detector equipped with a filter which lets light of a specific wavelength penetrate to the detector to analyze the concentration of excited products or reactants during the etching process. The emission signal generated by the gas discharge begins to rise or fall at the end of the etch cycle, thus indicating that material of a different chemical composition (that of the underlying layer) than that of the etched layer is being etched from the wafer surface.

Another end-point detection system includes laser inferometry, in which laser beams are directed toward the etched wafer surface. If the films on the wafer surface are transparent, then the laser beams reflected from the top and bottom of the etched layer interfere with each other. As the etching process reduces the thickness of the etched layer, the degree of interference between the laser beams changes. The elapsed time between the light maxima and light minima can be used to determine the etching rate. At the end of the etching process, the interference between the beams stops and the interference signal flattens out.

In contact etching processes, contact openings, or vias, are etched in an insulative layer to provide electrical contact between a conductive layer which underlies the insulative layer and a second conductive layer to subsequently be deposited on the insulative layer. In contact etching processes, the end point mode of determining the suitable end of an etching process cannot be used due to the relatively low exposure rate of the insulative layer to the plasma and because the plasma encounters no obvious stop layer to indicate when the etching process should be stopped. Therefore, a time mode is typically used to determine the end of contact etching processes.

According to the time mode, the time for plasma generation is programmed into the etcher. When the etch time has elapsed, plasma generation in the etcher may be manually or automatically terminated or attenuated at this point to prevent over etching of the semiconductor. However, the time mode fails to provide any indication of abnormal chamber conditions in the event that the plasma-forming source gas fails to initially ignite and generate the plasma in the chamber or the plasma intensity rises too high or falls too low for optimum etching. Consequently, batches of wafers may be under- or over-etched and require discarding.

Referring to the schematic of FIG. 1, a conventional plasma etching system, such as an MxP+ chamber available from the Applied Materials Corp. of Santa Clara, Calif., is generally indicated by reference numeral 10. The etching system 10 includes a reaction chamber 12 having a typically grounded chamber wall 14. A cathode 16 is positioned in the bottom portion of the chamber 12, and an electrostatic chuck 18 is provided on the cathode 16 for supporting a wafer 20 thereon. Plasma-generating source gases are introduced into the reaction chamber 12 through multiple openings 23 of a GDP (gas distribution plate) or showerhead 22 provided in the top of the reaction chamber 12. Volatile reaction products and unreacted plasma species are removed from the reaction chamber 12 by a gas removal system (not shown).

The etching system 10 further includes an end point detector system 26 which utilizes optical interferometry to detect the endpoint of the etching process. The end point detector system 26 includes a port 28 which is mounted in the side wall 14 of the reaction chamber 12 and includes a quartz window 29 recessed in a port opening 30 (FIG. 2). A fiber optic cable 34 connects the port 28 to a controller 36. Accordingly, during operation of the etching system 10, UV or visible light rays 33 are reflected from the wafer 20 and penetrate the quartz window 29 to the light sensor 32. The light sensor 32 is capable of measuring the constructive and destructive interference between the UV or visible light rays reflected off the etched layer on the wafer 20 as the layer on the wafer 20 changes from one material interface to another, in conventional fashion. The light sensor 32 thus continually senses the thickness of the layers during etching, and this data is sent to the controller 36. When the desired thickness of the layer or layers on the wafer 20 has been reached, the controller 36 terminates the etching process.

As shown in FIG. 2, over a prolonged period of continuous usage of the etching system 10, a layer of polymer deposition 38 typically accumulates on the port 28, including the quartz window 29 thereof, due to contact of plasma with these surfaces. This tends to interfere with accurate monitoring of the layers being etched on the wafer 20, since light reflected from the wafer 20 is inaccurately and incompletely transmitted through the quartz window 29 to the light sensor 32. Consequently, the port 28 and quartz window 29 must be cleaned and the polymer deposition 38 removed therefrom before use of the etching system 10 can be continued. Typically, about 2000 wafers 20 can be etched between periodic maintenance cleanings of the reaction chamber 12. However, periodic maintenance cleanings require inactivation of the reaction chamber 12 and this reduces throughput of wafers 20 in the etching system 10. Accordingly, a quartz window which is capable of prolonging the time required between periodic chamber cleanings is needed for increasing wafer throughput in an etching system.

SUMMARY OF THE INVENTION

An object of the present invention is to provide a new and improved end point detection window for end point detection during the processing of substrates.

Another object of the present invention is to provide a new and improved, dual-port end point detection window which is capable of prolonging the periods required between periodic chamber cleanings.

Still another object of the present invention is to provide a dual-port end point window detection which is capable of prolonging the accuracy of an end point detection system during prolonged periods of use.

Yet another object of the present invention is to provide a dual-port end point detection window which may be used in conjunction with various types of processing chambers or systems for substrates.

In accordance with these and other objects and advantages, the present invention comprises a dual-port endpoint detection window for a process chamber for substrates. The dual-port endpoint detection window of the present invention comprises a primary port and a secondary port each of which may be individually removably fitted with a light sensor for the endpoint detection system. A cover is provided for removably covering the secondary port. After the window of the primary port has become covered with material deposition as a result of prolonged use of the process chamber, the secondary port is uncovered for use and the light sensor is attached to the secondary port for continued use of the endpoint detection system through the secondary port.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in prolonging the use capability of a reaction chamber in an etching system between periodic chamber cleanings. However, the invention is not so limited in application, and while references may be made to such etching systems, the invention may be suitable for a variety of industrial and mechanical applications.

Figure 5:
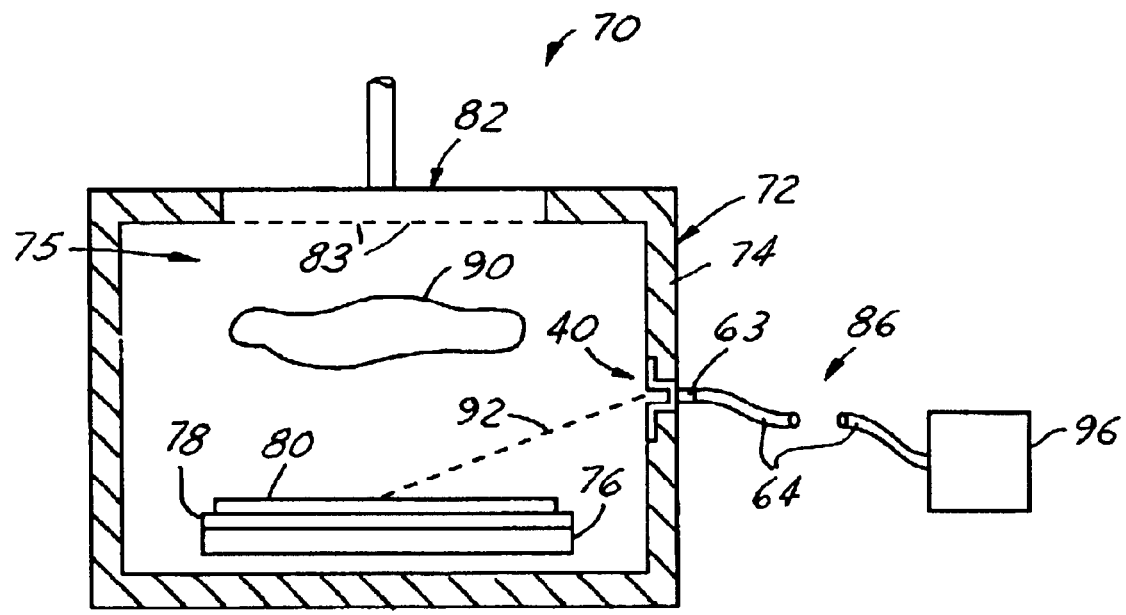
FIG. 5 is a schematic view of an etching system in implementation of the present invention.

An etching system in implementation of the present invention is generally indicated by reference numeral 70 in FIG. 5, and includes a reaction chamber 72 having a typically grounded chamber wall 74 that defines a chamber interior 75. A cathode 76 may be positioned in the bottom portion of the chamber interior 75, and an electrostatic chuck 78 is typically provided on the cathode 76 for supporting a wafer substrate 80 thereon. Plasma-generating source gases are introduced into the chamber interior 75 through multiple openings 83 of a GDP (gas distribution plate) or showerhead 82 provided in the top of the chamber interior 75. Volatile reaction products and unreacted plasma species are removed from the chamber interior 75 by a gas removal system (not shown), which may be conventional, in use as hereinafter described.

Figure 1:
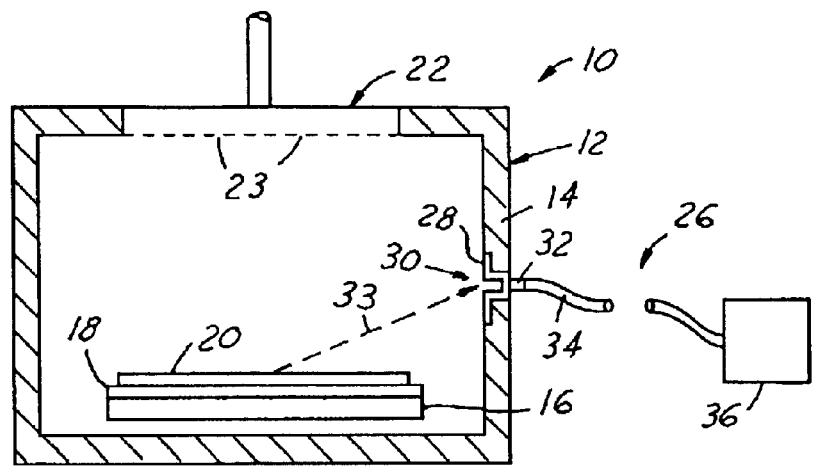
FIG. 1 is a schematic view of a typical conventional etching system for substrates.
Figure 2:
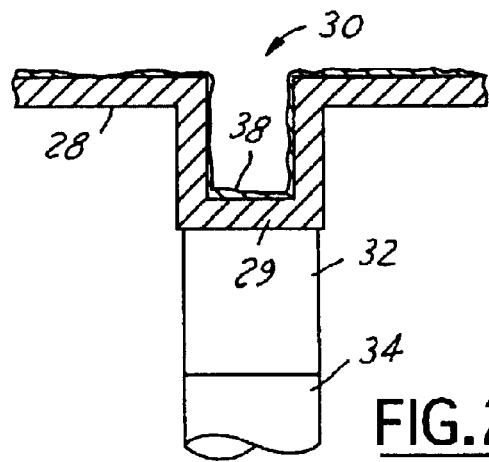
FIG. 2 is a cross-sectional view of an endpoint detection port for the etching system of FIG. 1.
Figure 3:
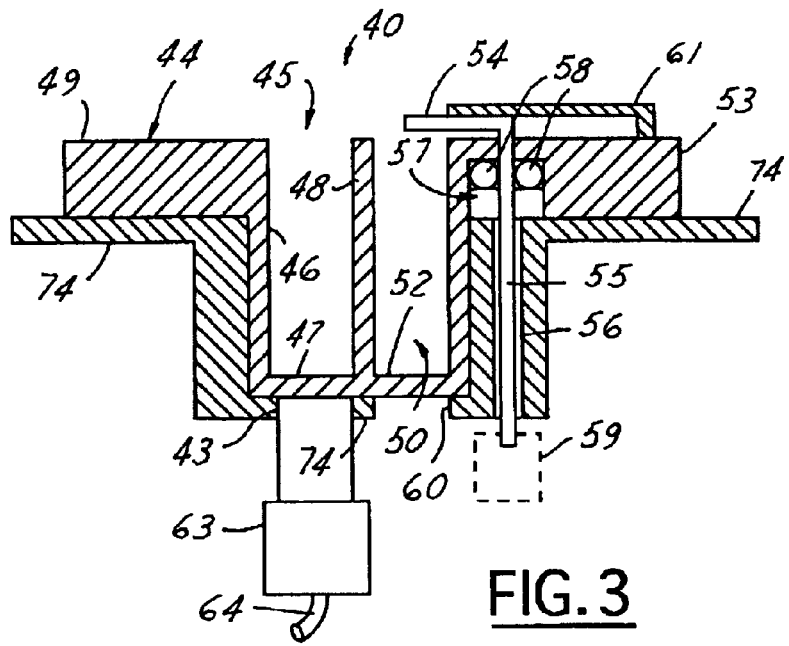
FIG. 3 is a sectional, partially schematic, view of a dual-port end point window of the present invention, with the secondary port of the window covered.
Figure 4:
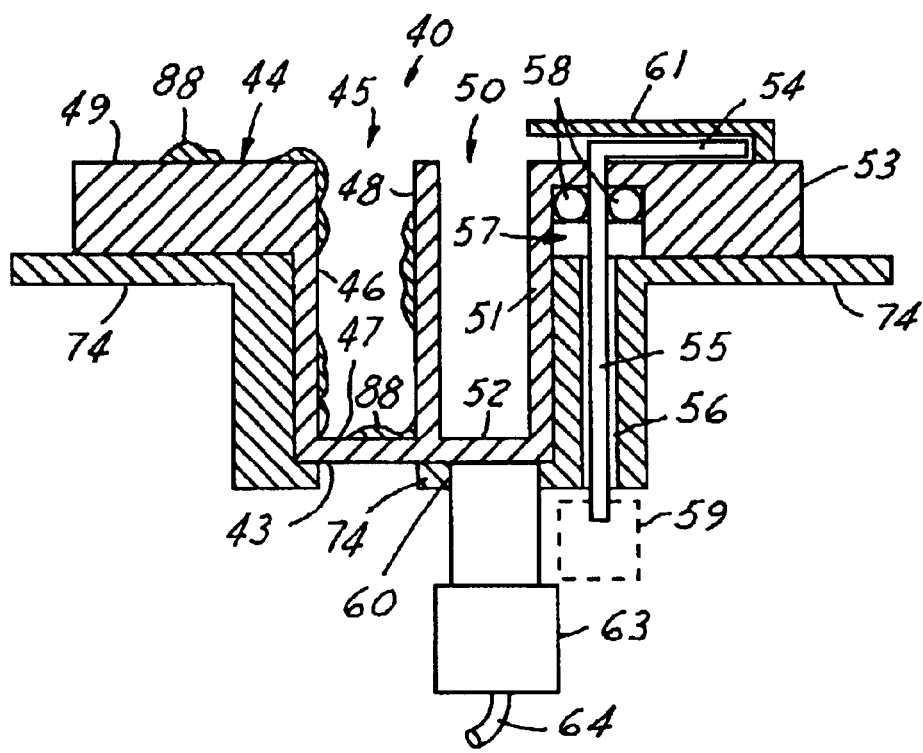
FIG. 4 is a sectional, partially schematic, view of the dual-port end point window of the present invention, with the secondary port of the window uncovered for use.

An illustrative embodiment of the dual port end point detection window of the present invention is generally indicated by reference numeral 40 and is a component part of an end point detector system 86 for detecting an end point of an etching process carried out on the wafer substrate 80, as hereinafter described. As illustrated in FIGS. 3 and 4, the dual port end point detection window 40 includes a window plate 44 that is typically mounted in a recess (not shown) in the chamber side wall 74. The window plate 44 includes a plate flange 49 and a plate flange 53, each of which is secured to the interior surface of the chamber wall 74 in the chamber interior 75, according to the knowledge of those skilled in the art. The window plate 44 further includes a primary window recess 45 which has a window side wall 46 and is separated from an adjacent, secondary window recess 50 by a partition 48. A translucent primary window 47, which may be constructed of quartz, extends between the window side wall 46 and the partition 48. A primary sensor port 43 is provided in the chamber wall 74 adjacent to the primary window 47 and removably receives a light sensor 63 of the end point detector system 86, which light sensor 63 may be conventional. The secondary window recess 50 includes a window side wall 51 disposed opposite the partition 48. A typically quartz, translucent secondary window 52 extends between the window side wall 51 and the partition 48. A secondary sensor port 60 is provided in the chamber wall 74 adjacent to the secondary window 52 and removably receives the light sensor 63 after use of the primary window 47 is discontinued, as hereinafter described.

An elongated shaft bore 56 extends through the chamber wall 74 in adjacent, parallel relationship to the secondary window recess 50, and accommodates an elongated shaft 55 one end of which is engaged by a shaft rotating mechanism 59. The opposite end of the shaft 55 extends through a cavity 57 provided in the plate flange 53 of the window plate 44, and a window cover flange 54 is provided on the end of the shaft 55. A rubber or plastic seal ring 58 typically encircles the shaft 55 in the cavity 57. Accordingly, by rotation of the shaft 55 by operation of the shaft rotating mechanism 59, the window cover flange 54 can be selectively positioned in the configuration of FIG. 3, in which the window cover flange 54 covers the secondary window recess 50 and blocks the secondary window 52 from the chamber interior 75; and the configuration of FIG. 4, in which the window cover flange 54 uncovers the secondary window recess 50 and exposes the secondary window 52 to the chamber interior 75. A flange cover 61 may be mounted on the plate flange 53 for covering the window cover flange 54 when the window cover flange 54 is disposed in the open position of FIG. 4. As further illustrated in FIG. 5, a fiber optic cable 64 connects the light sensor 63 to a controller 96 for the etching system 70, in conventional fashion.

Referring again to FIGS. 3–5, in typical use of the dual-port end point detection window 40 of the present invention, a wafer substrate 80 is subjected to a plasma etching process in the chamber interior 75 of the reaction chamber 72, typically using conventional process parameters which are known by those skilled in the art. Prior to commencement of the etching process, however, the shaft rotating mechanism 59 of the dual port window 40 is operated to position the window cover flange 54 in the covering position of FIG. 3, wherein the window cover flange 54 covers the secondary window recess 50 and blocks the secondary window 52 from the chamber interior 75. The primary window 47 remains exposed to the chamber interior 75 through the primary window recess 45, and the light sensor 63 is removably inserted in the primary port 43. Accordingly, during the ensuing plasma etch process, a plasma 90 generated in the chamber interior 75 etches insulative and/or conductive layers (not shown) on the wafer substrate 80, in conventional fashion. Visible or ultraviolet light rays 92 are reflected from the layers being etched on the substrate 80 and strike the primary window 47 in the exposed primary window recess 45 of the dual port window 40. These light rays 92 are transmitted through the translucent primary window 47 to the light sensor 63 removably fitted in the primary port 43. The light sensor 63 transmits data indicative of the thickness of the etched layers to the controller 96, which terminates operation of the etching process when the desired thickness or profile of the layers on the substrate 80 has been reached, in conventional fashion.

As the plasma 90 contacts the window plate 44, including the interior surfaces of the primary window side wall 46, the partition 48 and the primary window 47, over time polymer material deposition 88 accumulates on those surfaces. Consequently, the material deposition 88 on the primary window 47 tends to block or impede and interfere with transmission of the light rays 92 through the primary window 47 to the light sensor 63. Because the secondary window recess 50 remains blocked by the window cover flange 54, however, the secondary window 52 remains unexposed to the plasma 90 in the chamber interior 75, and thus, no material deposition 88 accumulates on the secondary window 52. Accordingly, the window cover flange 54 is removed from the position of FIG. 3, in which the window cover flange 54 blocks the secondary window recess 50 from the chamber interior 75, to the position of FIG. 4, in which the window cover flange 54 uncovers the secondary window recess 50 and exposes the secondary window 52 to the chamber interior 75. Additionally, the light sensor 63 is removed from the primary sensor port 43 and removably inserted in the secondary sensor port 60, adjacent to the secondary window 52. During subsequent etching of wafer substrates 80 in the chamber interior 75, light rays 92 are reflected from the substrate 80 and strike the secondary window 52. These light rays 92 are transmitted unimpeded through the secondary window 52, and the light sensor 63 transmits data which indicates the thickness of the etched layers on the substrate 80 to the controller 96, as heretofore described. After prolonged usage, material deposition 88 accumulates on the secondary window 52, and the reaction chamber 72 must therefore undergo periodic cleaning to remove the material deposition 88 and resume operation of the etching system 70. Upon subsequent use of the etching system 70 after the periodic cleaning, the secondary window recess 50 is again covered using the window cover flange 54 and the primary window 47 is initially used for end point detection. After the material deposition 88 again accumulates on the primary window 47, the secondary window 52 is again uncovered for use in the manner heretofore described.

While the preferred embodiments of the invention have been described above, it will be recognized and understood that various modifications can be made and the appended claims are intended to cover all such modifications which may fall within the spirit and scope of the invention.

What is claimed is:

1. An end point detection window for a process chamber, comprising: at least two windows for mounting in the process chamber; at least two sensor ports provided adjacent to said at least two windows, respectively; and a cover flange provided adjacent to one of said at least two windows for selectively covering and uncovering said one of said at least two windows, the end point detection window further comprising a window plate for engaging said process chamber and wherein said at least two windows are provided in said window plate, said cover flange further comprises a shaft for rotatably engaging said window plate and a window flange cover carried by said shaft for selectively covering said one of said at least two windows, and a shaft rotating mechanism engaging said shaft for selectively rotating said shaft.

2. The end point detection window of claim 1 further comprising at least two window recesses for communication with the process chamber and wherein said at least two windows are recessed in said at least two window recesses, respectively.

3. The end point detection window of claim 1 further comprising at least two window recesses provided in said window plate for communication with the process chamber and wherein said at least two windows are recessed in said at least two window recesses, respectively.

4. The end point detection window of claim 1 wherein said flange cover is carried by said window plate for covering said window cover flange when said window cover flange selectively covers said one of said at least two windows.

5. The end point detection window of claim 4 further comprising at least two window recesses provided in said window plate for communication with the process chamber and wherein said at least two windows are recessed in said at least two window recesses, respectively.

6. The end point detection window of claim 1 wherein said at least two windows each comprises quartz.

7. The end point detection window of claim 6 farther comprising at least two window recesses for communication with the process chamber and wherein said at least two windows are recessed in said at least two window recesses, respectively.

8. The end point detection window for a process chamber, comprising: a window plate having a primary window recess and a secondary window recess for mounting in the process chamber, a partition separating said primary window recess from said secondary window recess; a primary window provided in said primary window recess and a secondary window provided in said secondary window recess; a primary sensor port provided adjacent to said primary window and a secondary sensor port provided adjacent to said secondary window; and a cover flange provided adjacent to said secondary window recess for selectively covering and uncovering said secondary window, the end point detection window further comprising a flange cover carried by said window plate for covering said secondary window cover flange when said window cover flange selectively covers said secondary window.

9. The end point detection window of claim 8 wherein said cover flange comprises a shaft for rotatably engaging said window plate, said window cover flange carried by said shaft for selectively covering said one of said at least two windows, and a shaft rotating mechanism engaging said shaft for selectively rotating said shaft.

10. The end point detection window of claim 8 wherein said primary window and said secondary window each comprises quartz.

* * * * *